(12) United States Patent
Chang et al.

(10) Patent No.: US 6,204,159 B1
(45) Date of Patent: Mar. 20, 2001

(54) METHOD OF FORMING SELECT GATE TO IMPROVE RELIABILITY AND PERFORMANCE FOR NAND TYPE FLASH MEMORY DEVICES

(75) Inventors: Kent Kuohua Chang, Cupertino; Kenneth Wo-Wai Au, Fremont; Yuesong He, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/349,603

(22) Filed: Jul. 9, 1999

(51) Int. Cl.$^7$ ................................. H01L 21/336
(52) U.S. Cl. ................... 438/594; 438/258; 438/593
(58) Field of Search ..................... 438/258, 593, 438/594, FOR 189, FOR 203, FOR 212, FOR 490

(56) References Cited

U.S. PATENT DOCUMENTS

| | | | |
|---|---|---|---|
| 5,008,212 | * | 4/1991 | Chen . |
| 5,278,439 | | 1/1994 | Ma et al. ........................ 257/319 |
| 5,427,967 | * | 6/1995 | Sadjadi et al. . |
| 5,429,969 | * | 7/1995 | Chang . |
| 5,445,983 | | 8/1995 | Hong . |
| 5,498,559 | * | 3/1996 | Chang . |
| 5,637,895 | | 6/1997 | Iwata et al. ..................... 257/315 |
| 5,793,079 | | 8/1998 | Georgescu et al. ............ 257/316 |
| 5,805,499 | | 9/1998 | Haddad ....................... 365/185.19 |
| 5,856,943 | | 1/1999 | Jeng ............................ 365/185.14 |
| 5,879,990 | * | 3/1999 | Dormans et al. . |
| 5,963,806 | * | 10/1999 | Sung et al. . |
| 6,040,216 | * | 3/2000 | Sung . |

\* cited by examiner

Primary Examiner—George Fourson
Assistant Examiner—Joannie A. Garcia
(74) Attorney, Agent, or Firm—Renner, Otto, Boisselle & Sklar, LLP

(57) ABSTRACT

In one embodiment, the present invention relates to a method of forming a NAND type flash memory device, involving the steps of growing a first oxide layer over at least a portion of a substrate, the substrate including a core region and a periphery region, the core region including a flash memory cell area and a select gate area and the periphery region including a high voltage transistor area and low voltage transistor area; depositing a first doped amorphous silicon layer over at least a portion of the first oxide layer; depositing a dielectric layer over at least a portion of the first doped amorphous silicon layer; removing portions of the first oxide layer, the first doped amorphous silicon layer, and the dielectric layer in the select gate area of the core region and the high voltage transistor area and the low voltage transistor area the periphery region; growing a second oxide layer over at least a portion of the substrate in the select gate area of the core region and the high voltage transistor area and the low voltage transistor area the periphery region; removing portions of the second oxide layer in the select gate area of the core region and the low voltage transistor area the periphery region; growing a third oxide layer over at least a portion of the substrate in the select gate area of the core region and the low voltage transistor area of the periphery region; depositing a second doped amorphous silicon layer over at least a portion of the dielectric layer, the second oxide layer and the third oxide layer; and forming a flash memory cell in the flash memory cell area of the core region, a select gate transistor in the select gate area of the core region, a low voltage transistor in the low voltage transistor area of the periphery region, and a high voltage transistor in the high voltage transistor area of the periphery region.

20 Claims, 7 Drawing Sheets

US 6,204,159 B1

METHOD OF FORMING SELECT GATE TO IMPROVE RELIABILITY AND PERFORMANCE FOR NAND TYPE FLASH MEMORY DEVICES

TECHNICAL FIELD

The present invention generally relates to simplified methods of making flash memory devices such as EEPROMs. More particularly, the present invention relates to simplified methods of making NAND type flash memory devices characterized by improved select gate performance.

BACKGROUND ART

Semiconductor devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 11 are coupled together in a NAND-type circuit configuration, such as, for example, the configuration illustrated in prior art FIG. 1b. Each memory cell 14 has a drain 14a, a source 14b and a stacked gate 14c. A plurality of memory cells 14 connected together in series with a drain select transistor at one end and a source select transistor at the other end to form a NAND string as illustrated in prior art FIG. 1b. Each stacked gate 14c is coupled to a word line (WL0, WL1, . . . , WLn) while each drain of the drain select transistors are coupled to a bit line (BL0, BL1, . . . , BLn). Lastly, each source of the source select transistors are coupled to a common source line Vss. Using peripheral decoder and control circuitry, each memory cell 14 can be addressed for programming, reading or erasing functions.

Prior art FIG. 1c represents a fragmentary cross section diagram of a typical memory cell 14 in the core region 11 of prior art FIGS. 1a and 1b. Such a cell 14 typically includes the source 14b, the drain 14a and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, for example, prior art FIG. 1b). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

The process for making such NAND type flash memory devices includes numerous individual processing steps. Each flash memory device must be fabricated in the same manner as other flash memory devices to provide consistent performance and reliability. Generally speaking, the fewer the number of processing steps, the easier it is to fabricate uniform flash memory devices.

For example, fabricating the select gate transistors and the flash memory cells in the core region of NAND type flash memory devices is complicated and involves numerous processing steps. Conventional fabrication techniques involve initially growing a select gate oxide over the entire core region or substrate, providing a tunnel oxide mask over the select gate areas, etching the exposed oxide, removing the tunnel oxide mask, cleaning the substrate, and growing a tunnel oxide layer. The process may further involve various inspection and evaluation steps after one or more of the numerous processing steps.

There are several concerns with such a process. For instance, there is a high defect density associated with using the tunnel oxide mask. A so-called Poly 1 contact is undesirably employed as a select gate interconnect. As a result, excessively high or low Poly 1 doping levels affect device performance (charge gain/loss problems). Residual oxides are common place, leading to diminished electrical properties.

In view of the aforementioned concerns and problems, there is a need for flash memory cells of improved quality and more efficient methods of making such memory cells.

SUMMARY OF THE INVENTION

As a result of the present invention, non-volatile flash memory device fabrication is not only simplified, but devices having improved reliability are obtainable. By employing the simplified methods of the present invention which eliminate the use of steps associated with using a tunnel oxide mask, forming a flash memory device having a low defect density, minimized charge gain/loss concerns from high/low Poly 1 doping, and fewer select gate interconnection problems is facilitated.

In one embodiment, the present invention relates to a method of forming a NAND type flash memory device, involving the steps of growing a first oxide layer over at least a portion of a substrate, the substrate including a core region and a periphery region, the core region including a flash memory cell area and a select gate area and the periphery region including a high voltage transistor area and low voltage transistor area; depositing a first doped amorphous silicon layer over at least a portion of the first oxide layer; depositing a dielectric layer over at least a portion of the first doped amorphous silicon layer; removing portions of the first oxide layer, the first doped amorphous silicon layer, and the dielectric layer in the select gate area of the core region and the high voltage transistor area and the low voltage transistor area the periphery region; growing a second oxide layer over at least a portion of the substrate in the select gate area of the core region and the high voltage transistor area and the low voltage transistor area the periphery region; removing portions of the second oxide layer in the select gate area of the core region and the low voltage transistor area the periphery region; growing a third oxide layer over at least a portion of the substrate in the select gate area of the core region and the low voltage transistor area of the periphery region; depositing a second doped amorphous silicon layer over at least a portion of the dielectric layer, the second oxide layer and the third oxide layer; and forming a flash memory cell in the flash memory cell area of the core region, a select gate transistor in the select gate area of the core region, a low voltage transistor in the low voltage transistor area of the periphery region, and a high voltage transistor in the high voltage transistor area of the periphery region.

In another embodiment, the present invention relates to a method of forming a flash memory cell and a select gate of a NAND type flash memory device, involving the steps of growing a first oxide layer having a thickness from about 70 Å to about 110 Å over at least a portion of a substrate, the substrate including a core region, the core region including a flash memory cell area and a select gate area; depositing a first doped amorphous silicon layer over at least a portion of the first oxide layer; depositing a dielectric layer over at least a portion of the first doped amorphous silicon layer; removing portions of the first oxide layer, the first doped amorphous silicon layer, and the dielectric layer in the select gate area of the core region; growing a second oxide layer having a thickness from about 150 Å to about 190 Å over at least a portion of the substrate in the select gate area of the core region; depositing a second doped amorphous silicon layer over at least a portion of the dielectric layer and the second oxide layer; and forming a flash memory cell in the flash memory cell area of the core region and a select gate transistor in the select gate area of the core region.

In yet another embodiment, the present invention relates to a method of forming a NAND type flash memory device, involving the steps of growing a first oxide layer having a thickness from about 70 Å to about 110 Å over at least a portion of a substrate, the substrate including a core region and a periphery region, the core region including a flash memory cell area and a select gate area and the periphery region including a high voltage transistor area and low voltage transistor area; depositing a first phosphorus doped amorphous silicon layer over at least a portion of the first oxide layer; depositing a multilayer dielectric over at least a portion of the first phosphorus doped amorphous silicon layer; removing portions of the first oxide layer, the first phosphorus doped amorphous silicon layer, and the multi-layer dielectric in the select gate area of the core region and the high voltage transistor area and the low voltage transistor area the periphery region; growing a second oxide layer having a thickness from about 260 Å to about 300 Å over at least a portion of the substrate in the select gate area of the core region and the high voltage transistor area and the low voltage transistor area the periphery region; removing portions of the second oxide layer in the select gate area of the core region and the low voltage transistor area the periphery region; growing a third oxide layer having a thickness from about 150 Å to about 190 Å over at least a portion of the substrate in the select gate area of the core region and the low voltage transistor area of the periphery region; depositing a second phosphorus doped amorphous silicon layer over at least a portion of the multilayer dielectric, the second oxide layer and the third oxide layer; depositing a tungsten silicide layer over the second phosphorus doped amorphous silicon layer; and forming a flash memory cell in the flash memory cell area of the core region, a select gate transistor in the select gate area of the core region, a low voltage transistor in the low voltage transistor area of the periphery region, and a high voltage transistor in the high voltage transistor area of the periphery region.

BRIEF DESCRIPTION OF DRAWINGS

FIG. 2b is a plan layout view of the core portion of the NAND-type flash memory device of FIG. 2a.

DISCLOSURE OF INVENTION

Figure 1A:
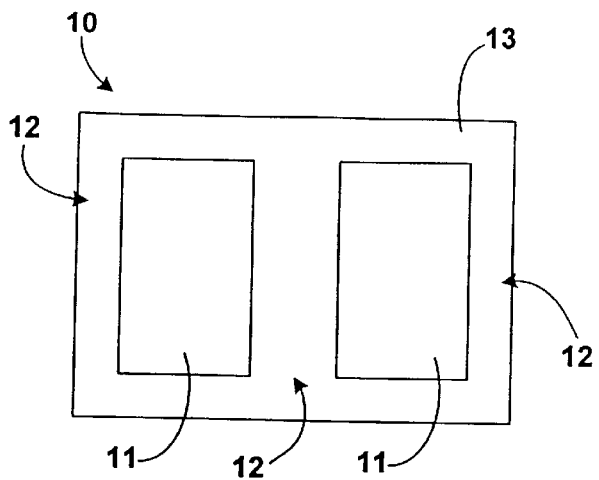
FIG. 1a is a plan view illustrating a prior art layout of a flash memory chip.

As a result of the present invention, non-volatile flash memory device fabrication is not only simplified, but devices having improved reliability are obtainable. By employing the simplified methods of the present invention which eliminate the use of steps associated with using a tunnel oxide mask, forming a flash memory device having a low defect density, minimized charge gain/loss concerns from high/low Poly 1 doping, and fewer select gate interconnection problems is facilitated.

The present invention is described with reference to the drawings wherein like reference numerals are used to refer to like elements throughout. The present invention relates to a flash memory device and a method for its manufacture that, according to one aspect of the present invention, eliminates the dual core oxide processing steps. Consequently, the steps used in forming the high and low voltage gate transistor structures of the periphery region may be used to construct the select gate transistors, thereby substantially reducing the number of processing steps needed to construct the flash memory device.

The present invention may be understood and its advantages appreciated in conjunction with the process of FIGS.

2–14. A circuit schematic diagram illustrating a core portion 11 of a NAND-type flash memory device is illustrated in FIG. 2a. The core portion 11 includes a memory cell region 22 which is bounded on one side by a drain select transistor portion 24 and bounded on another side by a source select transistor portion 26. Each of the select transistor portions 24 and 26 contain select gate transistors 24a–24c and 26a–26c, respectively, which operate to selectively activate a desired bit line (for example, BLN−1, BLN, BLN+1) by ensuring the selectivity of each bit line and preventing the cell current from conducting current through the bit line during a programming operation as is known by those skilled in the art.

Figure 1C:
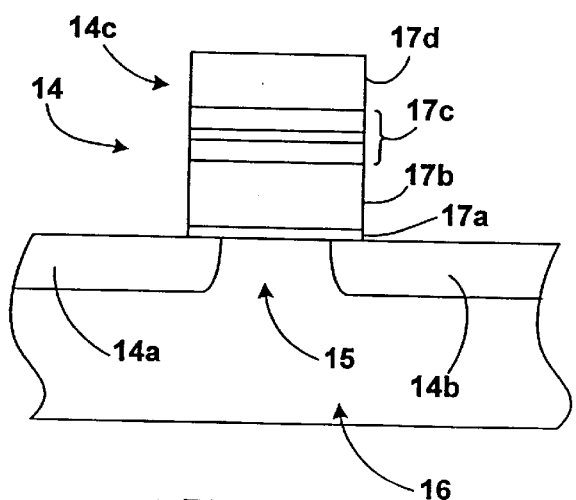
FIG. 1c is a fragmentary cross section illustrating a prior art stacked gate flash memory cell.
Figure 1B:
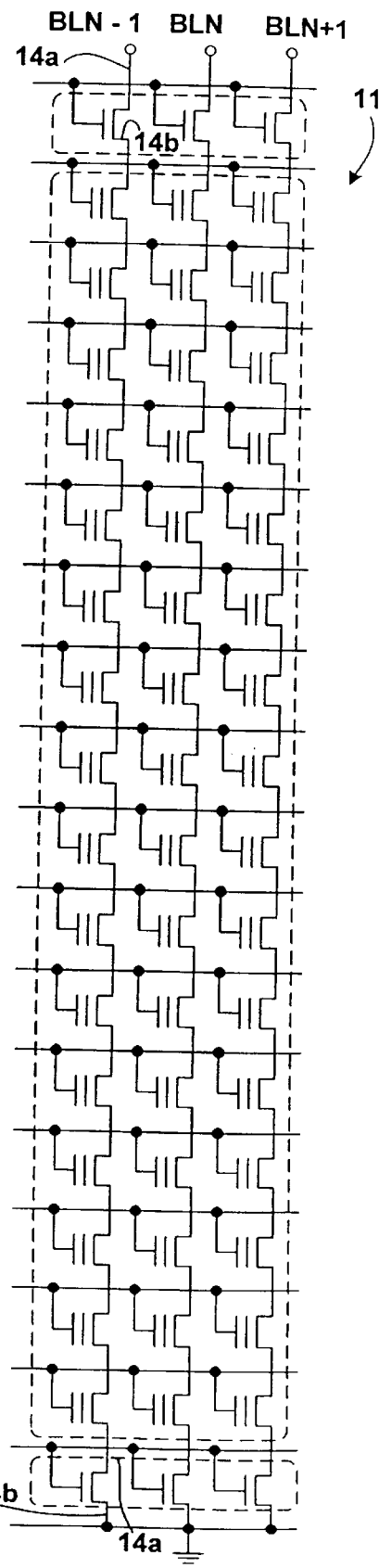
FIG. 1b is a schematic diagram illustrating a prior art NAND-type flash memory circuit configuration.
Figure 2B:
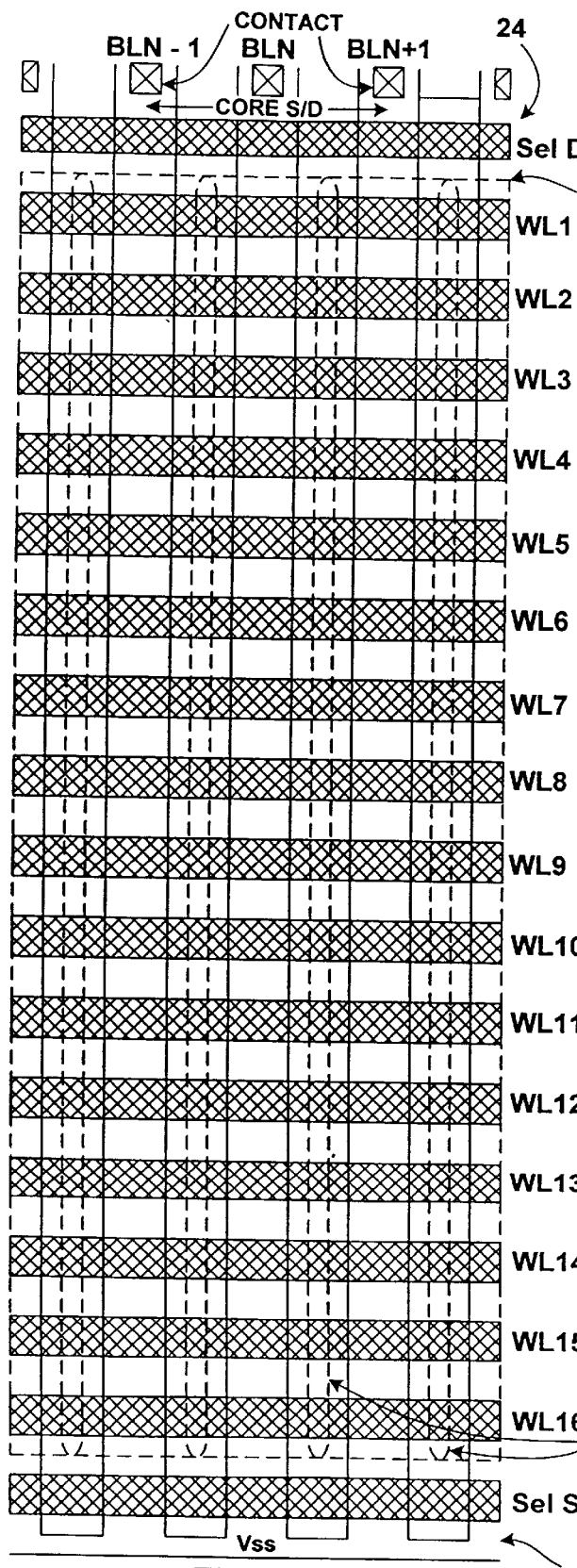
Figure 2A:
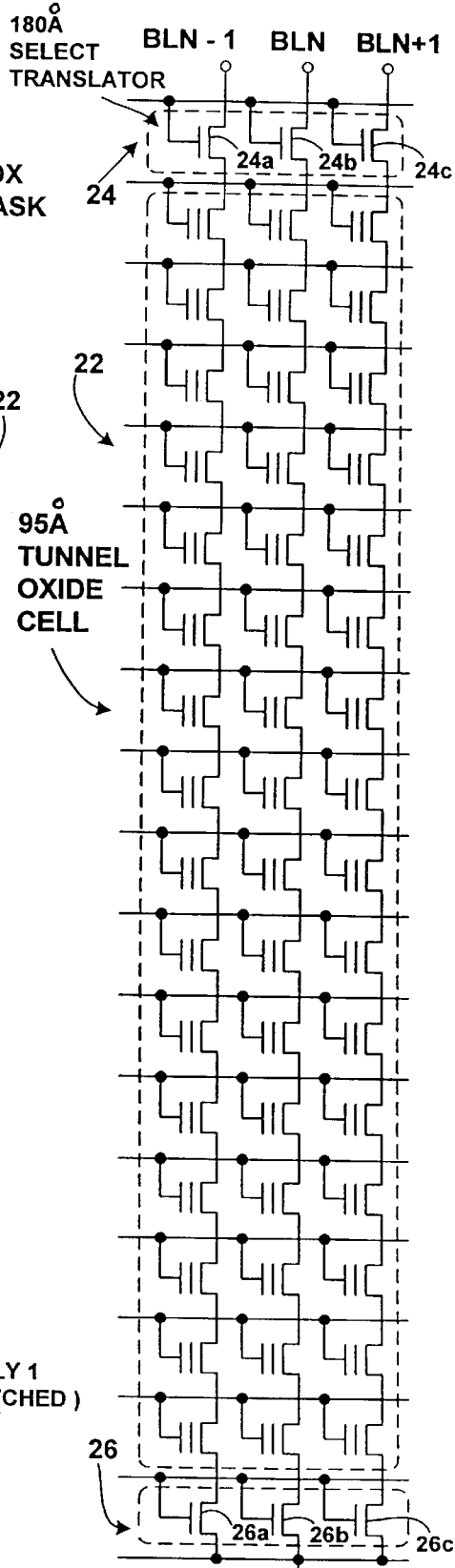
FIG. 2a is a schematic diagram illustrating a core portion of a NAND-type flash memory device.

In the NAND-type flash memory process which forms the core circuit 12 of FIG. 2a and its corresponding circuit layout (of which FIG. 2b is a plan view), a simplified tunnel and gate oxide process is used to form the memory cell oxides and the select gate transistor oxides, respectively (since the memory cell oxides and select gate transistor oxides have different thicknesses). In addition, formation of the high and low voltage transistors in the periphery region 14 and in particular their corresponding oxides are incorporated into the processes (see, for example, FIG. 1). The process may further include a double doped amorphous silicon layer to generate stacked gate structures in the core region 12.

The core select gate transistors 24a–24c and 26a–26c are somewhat similar in structure to the stacked gate flash memory structures in the memory cell region 22 except that their gate oxide is approximately twice as thick as the cell oxide (also called the tunnel oxide) in the stacked gate structure of the memory cell (about 170 Å compared to about 90 Å). The select transistors 24a–24c utilize a gate oxide of about 170 Å to improve the reliability of the transistors by reducing the vulnerability of the devices to band to band tunneling induced hot carrier stress during programming. The select gate transistors 24a–24c and 26a–26c further differ from the stacked gate flash memory cell structures of the region 22 because they operate as conventional MOS transistors and therefore have one doped amorphous silicon layer as a standard MOS transistor configuration. A plan circuit layout view of the conventional NAND-type circuit arrangement 12 is illustrated in FIG. 2b.

Prior to providing a specific example of the methods of the present invention, a general example is provided. A first gate oxide is grown using any suitable means, such as dry oxidation, wet oxidation or thermal oxidation, on at least a portion of a semiconductor substrate (the core and periphery regions) typically made of silicon. The first gate oxide later serves as the stacked memory cell tunnel oxide. In one embodiment, the first gate oxide or stacked memory cell tunnel oxide has a thickness from about 70 Å to about 110 Å. In another embodiment, the stacked memory cell tunnel oxide has a thickness from about 80 Å to about 110 Å.

Next, a first doped amorphous silicon layer is provided using any suitable means over at least a portion of the first gate oxide (over the core and periphery regions). The first doped amorphous silicon layer later serves as the floating gate of the stacked memory cell (also termed Poly 1). In one embodiment, the first doped amorphous silicon layer has a thickness from about 700 Å to about 1,100 Å, and preferably from about 800 Å to about 1,000 Å. A dielectric layer is provided using any suitable means over at least a portion of the first doped amorphous silicon layer. The dielectric layer preferably contains three layers; namely two oxide layers sandwiching a nitride layer (a so-called ONO layer). The dielectric layer later serves as the interpoly dielectric layer of the stacked memory cell. In one embodiment, the dielectric layer has a thickness from about 100 Å to about 160 Å, and preferably from about 120 Å to about 140 Å.

A mask such as a suitable photoresist is used to cover the stacked memory cell areas of the core region and the exposed portion of the substrate is etched down to the silicon substrate (the dielectric layer, the first doped amorphous silicon layer and first gate oxide are removed in the periphery region and select gate areas of the core region). Multiple etching steps may be employed to remove the dielectric layer, the first doped amorphous silicon layer and first gate oxide.

A second gate oxide layer is provided using any suitable means, such as dry oxidation, wet oxidation or thermal oxidation, on at least a portion of the exposed portions of the silicon substrate (over a portion of the core region and over all of the periphery region). The second gate oxide later serves as the gate oxide for subsequently formed high voltage transistors in the periphery region. In one embodiment, the second gate oxide has a thickness from about 260 Å to about 300 Å. In another embodiment, the second gate oxide has a thickness from about 270 Å to about 290 Å. The second gate oxide layer has a thickness that is greater than the first gate oxide layer (the second gate oxide layer also has a thickness that is greater than the third gate oxide layer discussed below).

A mask such as a suitable photoresist is used to cover the high voltage transistor areas of the periphery region and the exposed portions of the second gate oxide layer are etched down to the silicon substrate (the second gate oxide in the low voltage transistor area of the periphery region and the select gate areas of the core region is removed) using suitable etch techniques such as wet etch techniques. The mask may, if necessary, cover the stacked memory cell areas of the core region to prevent degradation of the dielectric layer.

A third gate oxide layer is provided using any suitable means, such as dry oxidation, wet oxidation or thermal oxidation, over at least a portion of the exposed portions of the silicon substrate (over the low voltage transistor area of the periphery region and the select gate areas of the core region). The third gate oxide later serves as the gate oxide for subsequently formed low voltage transistors in the periphery region and the select gate transistors in the core region. In one embodiment, the third gate oxide has a thickness from about 150 Å to about 190 Å. In another embodiment, the third gate oxide has a thickness from about 160 Å to about 180 Å. The third gate oxide layer has a thickness that is greater than the first gate oxide layer.

A second doped amorphous silicon layer is provided using any suitable means over at least a portion of the substrate (over the core and periphery regions). The second doped amorphous silicon layer later serves as the control gate of the stacked memory cell (also termed Poly 2), the select gate, the high voltage gate and the low voltage gate. In one embodiment, the second doped amorphous silicon layer has a thickness from about 1,000 Å to about 1,400 Å, and preferably from about 1,100 Å to about 1,300 Å. Additional layers are provided using any suitable means over portions of the second doped amorphous silicon layer. For example, a tungsten silicide layer and a silicon oxynitride layer may be provided over the second doped amorphous silicon layer.

A series of masks and etch steps (such as self aligned etch steps) are employed to form various structures including flash memory cells, select gates, low voltage gates, high voltage gates, word lines, interconnections, and the like. Using the configuration of the present invention, the Poly 2 is used as a conductive layer instead of Poly 1 as in conventional configurations. As a result, it is not necessary to open a Poly 1 contact area during the series of masks and etch steps. This aspect of the present invention not only simplifies the fabrication process, but also improves the quality and reliability of the resultant flash memory devices produced thereby. That is, contact performance using a Poly 2 contact is generally more reliable and better performing than a Poly 1 contact. Moreover, less punch-through problems are encountered using a Poly 2 contact instead of a Poly 1 contact. Steps associated with the use of a tunnel oxide mask, such as those employed in conventional processes, may be eliminated according to the present invention. These steps include an initial growth of an oxide having a thickness approximately appropriate for a select gate but too thick for a tunnel oxide, tunnel oxide mask and etching steps, and cleaning, inspection and evaluation steps.

In the above process, the first doped amorphous silicon layer (Poly 1) is used as the floating gate region for the core memory cells and the second doped amorphous silicon silicon layer (Poly 2) is used for the core memory cell control gates, the select gates in the core region and the gate regions for the periphery transistors (both high and low voltage). Consequently, the NAND-type process involves the fabrication of at least two types of devices including four types of devices; namely a stacked gate memory cell in the core region, a select gate transistor in the core region, a periphery low voltage transistor and a periphery high voltage transistor.

Figure 3:
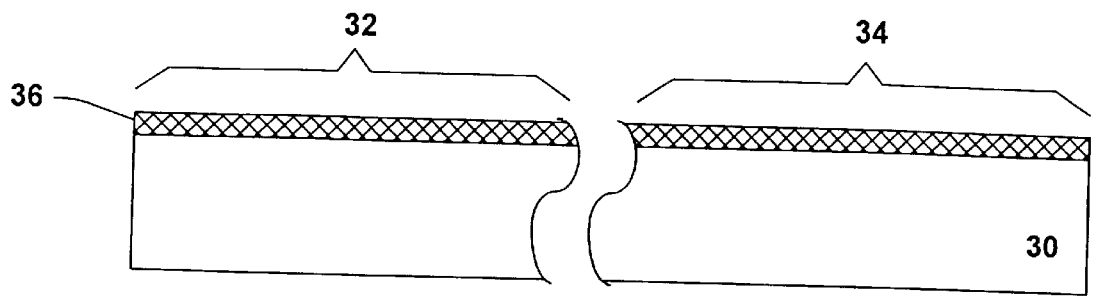
FIG. 3 is a cross sectional illustration of one aspect of a method of making a NAND type flash memory device in accordance with the present invention.

A semiconductor manufacturing process flow illustrating the NAND-type flash memory device process is described in greater detail in conjunction with FIGS. 3–13. Referring to FIG. 3, a substrate 30 is provided. The substrate 30 is typically a silicon substrate optionally with various elements, regions and/or layers thereover; including metal layers, barrier layers, dielectric layers, device structures, active regions such as active silicon regions or areas, active elements and passive elements including P wells, N wells, additional polysilicon gates, wordlines, source regions, drain regions, bit lines, bases, emitters, collectors, conductive lines, conductive plugs, etc. The substrate 30 has two main regions; namely, a core region 32 and a periphery region 34. A first gate oxide 36 is provided over at least a portion of the substrate 30 or over the entire substrate 30. The first gate oxide 36, which subsequently forms a memory cell tunnel oxide (see FIG. 12) has a thickness of about 87 Å in this embodiment. The first gate oxide 36 in this embodiment is formed by a dry oxidation process at about 1050° C. under 1.33 l of oxygen, 70 cc HCl, and 12.6 l of argon.

Figure 4:
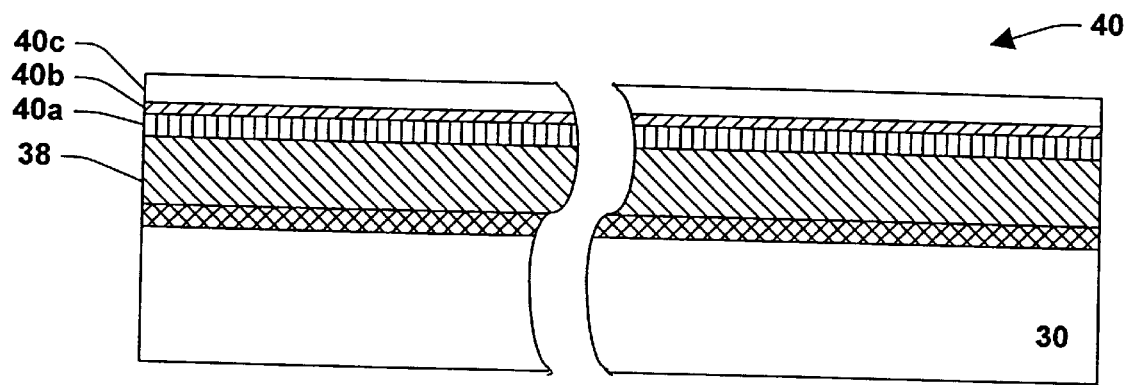
FIG. 4 is a cross sectional illustration of one aspect of a method of making a NAND type flash memory device in accordance with the present invention.

Referring to FIG. 4, a first doped amorphous silicon layer 38 is provided using an in situ doping process over at least a portion of the first gate oxide 36. In this embodiment, a phosphorus doped amorphous silicon layer is deposited via chemical vapor deposition (CVD) to form a doped amorphous silicon layer 38 at 530° C., 400 mTorr, $SiH_4$ at 2000 sccm, and a mixture of 1% by weight $PH_3$ in helium at about 22 sccm. The first doped amorphous silicon layer 38 (also termed Poly 1) subsequently forms the floating gate (see FIG. 12) of the stacked memory cell. The first doped amorphous silicon layer 38 has a thickness of about 900 Å. A dielectric layer 40 is provided over at least a portion of the first doped amorphous silicon layer 38. The dielectric layer 40 is an ONO multilayer dielectric containing three layers; namely an oxide layer 40a, a nitride layer 40b, and another oxide layer 40c. The dielectric layer subsequently forms the interpoly dielectric layer (see FIG. 12) of the stacked memory cell. The dielectric layer has a thickness of about 130 Å. Oxide layer 40a is deposited at a temperature of about 750° C. under $SiH_4$ at 20 cc, $N_2O$ at 1.2 l and a pressure of 600 mTorr via low pressure CVD (LPCVD) on the first doped amorphous silicon layer 38. Nitride is next deposited at a temperature of about 760° C. under $NH_3$ at 600 cc, $SiH_2Cl_2$ at 100 cc and a pressure of 330 mTorr to form a nitride layer 40b. The nitride layer 40b is oxidized with wet oxygen at a temperature of about 950° C. under $O_2$ at 5 l and $H_2$ at 9 l for 40 minutes to form another oxide layer 40c.

Figure 5:
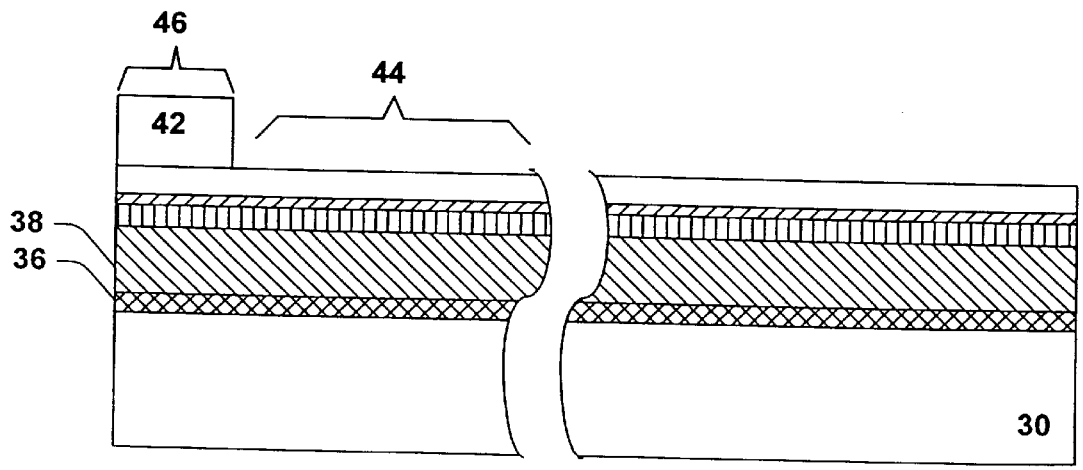
FIG. 5 is a cross sectional illustration of one aspect of a method of making a NAND type flash memory device in accordance with the present invention.

Referring to FIG. 5, a mask 42 is used to cover the stacked memory cell areas 46 of the core region 32 leaving the dielectric layer 40 exposed in the select gate area 44 of the core region 32 and in the periphery region 34. In this connection, the core region 32 contains select gate areas 44 and stacked memory cell areas 46. The mask 42 contains a suitable photoresist material and is formed using suitable photolithographic techniques including spin on deposition, selective irradiation, and development.

Figure 6:
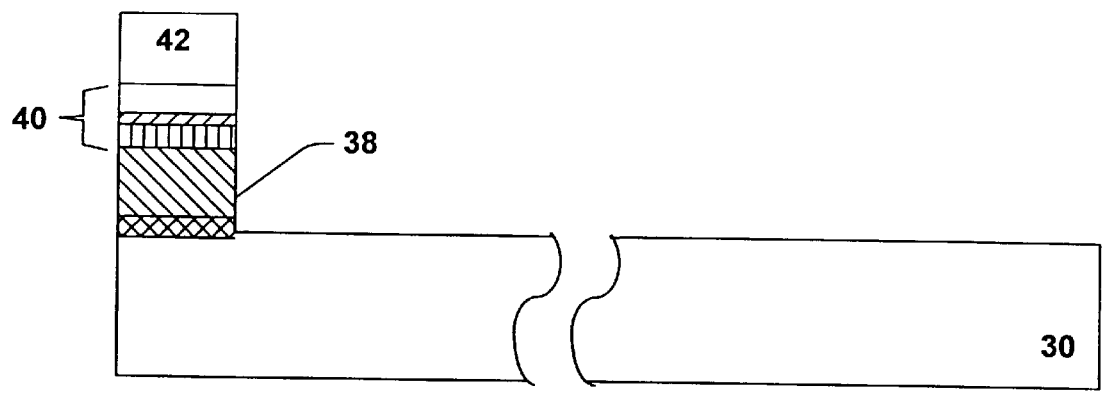
FIG. 6 is a cross sectional illustration of one aspect of a method of making a NAND type flash memory device in accordance with the present invention.

Referring to FIG. 6, the exposed portion of the structure is etched down to the substrate 30. Specifically, portions of the dielectric layer 40, the first doped amorphous silicon layer 38 and first gate oxide 36 are removed in the periphery region 34 and select gate areas 44 of the core region 32 using suitable etching techniques, including wet etching techniques.

Figure 7:
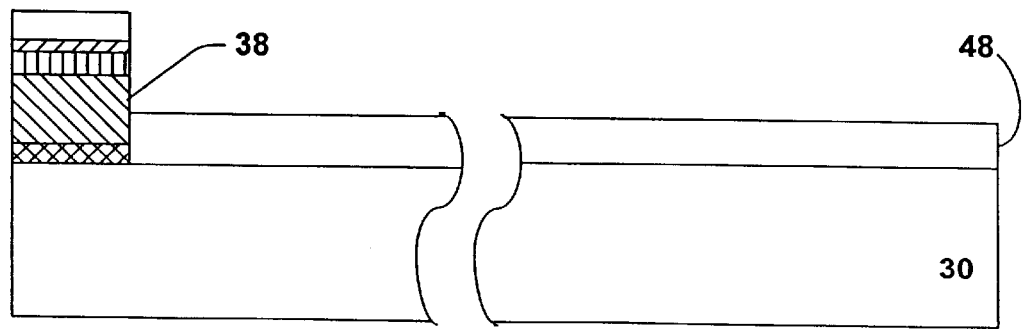
FIG. 7 is a cross sectional illustration of one aspect of a method of making a NAND type flash memory device in accordance with the present invention.

Referring to FIG. 7, second gate oxide layer 48 is provided on at least a portion of the exposed portions of the substrate 30 (over the select gate area 44 of the core region 32 and over the periphery region 34). In this embodiment, the second gate oxide layer 48 is formed by wet oxidation at about 800° C. under 6.4 l oxygen, 2.133 l of hydrogen, and 75 cc of HCl, and optionally annealing at about 900° C. under nitrogen. The second gate oxide 48 subsequently forms the gate oxide for the high voltage transistors in the periphery region (see FIG. 12). In this embodiment, the second gate oxide layer 48 has a thickness of about 285 Å.

Figure 8:
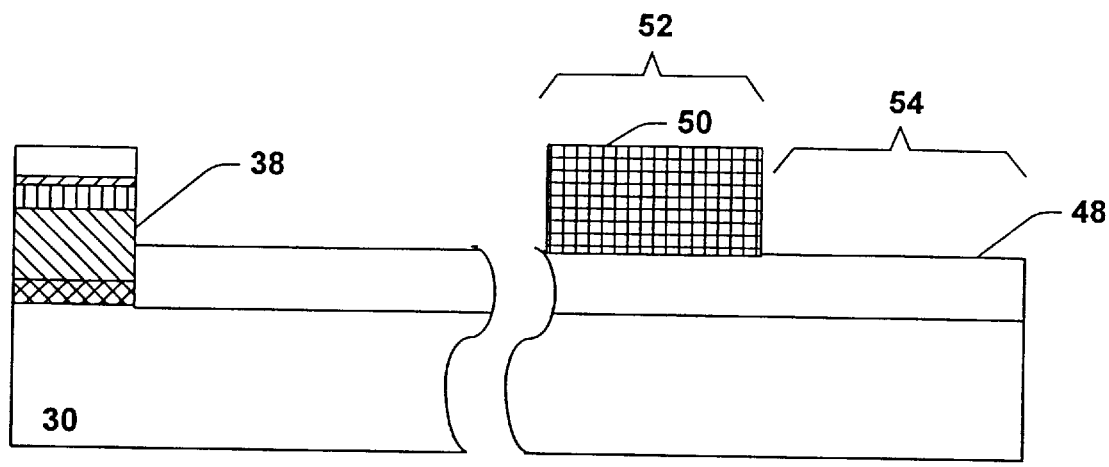
FIG. 8 is a cross sectional illustration of one aspect of a method of making a NAND type flash memory device in accordance with the present invention.

Referring to FIG. 8, a mask 50 is positioned to cover the high voltage transistor areas 52 of the periphery region 34. In this connection, the periphery region 34 contains high voltage transistor areas 52 and low voltage transistor areas 54. The mask 50 contains a suitable photoresist material and is formed using suitable photolithographic techniques including spin on deposition, selective irradiation, and development. Although not shown, the mask 50 may also cover the stacked memory cell areas 46 of the core region 32 to prevent degradation of the dielectric layer 40.

Figure 9:
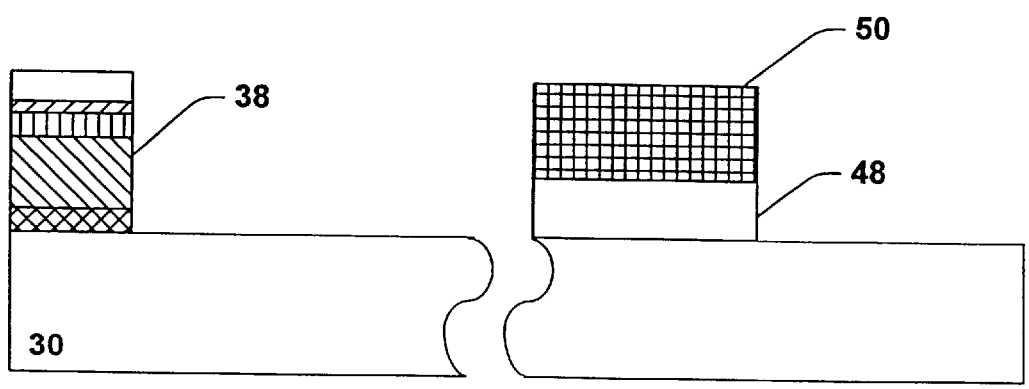
FIG. 9 is a cross sectional illustration of one aspect of a method of making a NAND type flash memory device in accordance with the present invention.

Referring to FIG. 9, the exposed portions of the second gate oxide layer 48 are etched down to the silicon substrate (the second gate oxide in the low voltage transistor area 54 of the periphery region 34 and the select gate areas 44 of the core region 32 is removed). Any suitable oxide selective etchant may be employed.

Figure 10:
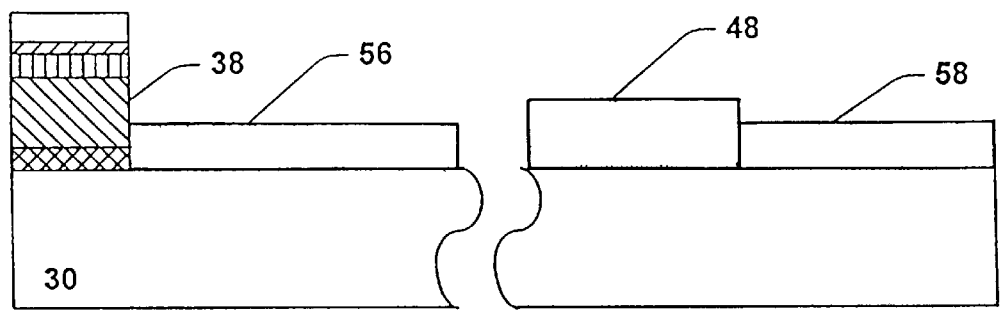
FIG. 10 is a cross sectional illustration of one aspect of a method of making a NAND type flash memory device in accordance with the present invention.

Referring to FIG. 10, a third gate oxide layer 56 and 58 is provided on at least a portion of the exposed portions of the substrate 30 (over the select gate area 44 of the core region 32 (56) and over the low voltage transistor area 54 the periphery region 34 (58)). In this embodiment, the third gate oxide layer 56 and 58 is formed by wet oxidation at about 800° C. under 6.4 l oxygen, 2.133 l of hydrogen, and 75 cc of HCl, and optionally annealing at about 900° C. under nitrogen. The third gate oxide layer 56 and 58 subsequently forms the gate oxides for the select gate transistors in the core region and the low voltage transistors in the periphery region (see FIG. 12). In this embodiment, the third gate oxide layer 56 and 58 has a thickness of about 168 Å.

Figure 11:
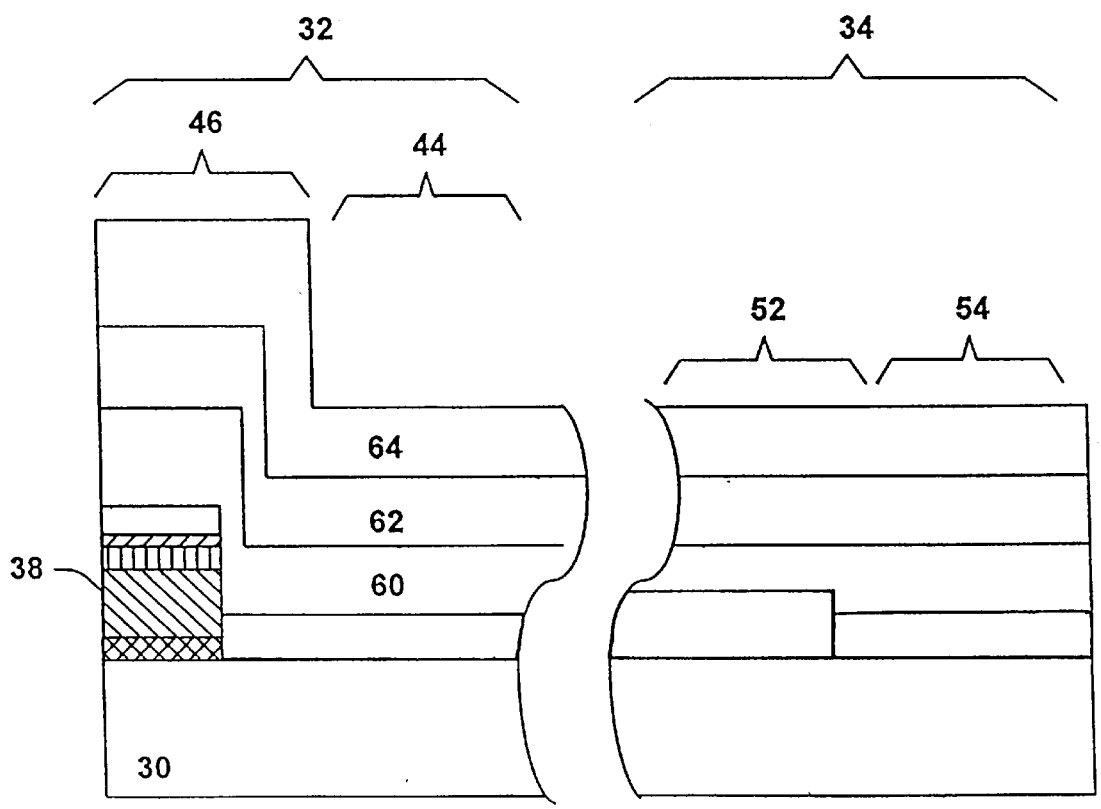
FIG. 11 is a cross sectional illustration of one aspect of a method of making a NAND type flash memory device in accordance with the present invention.

Referring to FIG. 11, a second doped amorphous silicon layer 60 is provided over at least a portion of the substrate (over the core region 32 and periphery region 34). In this embodiment, the phosphorus doped amorphous silicon layer is deposited via CVD to form a doped amorphous silicon layer 60 at 530° C., 400 mTorr, $SiH_4$ at 2000 sccm, and a mixture of 1% by weight $PH_3$ in helium at about 22 sccm. In this embodiment, the second doped amorphous silicon layer 60 has a thickness of about 1,200 Å. The second doped amorphous silicon layer 60 subsequently forms the control gate of the stacked memory cell (also termed Poly 2), the select gate, the high voltage gate and the low voltage gate (see FIG. 12).

A tungsten silicide layer 62 is provided over at least a portion of the second doped amorphous silicon layer 60. The tungsten silicide layer 62 may be formed by suitable means. In this embodiment, the tungsten silicide is deposited via CVD techniques at a temperature of about 565° C. and a pressure of about 93 Pa. The gas flow includes $SiH_2Cl_2$ and $WF_6$. The gas flow may further contain an inert gas, such as Ar. After the tungsten suicide deposition, an optional rapid thermal anneal (RTA) is performed in a nitrogen atmosphere. The tungsten silicide layer 62 has a thickness from about 1,000 Å to about 1,800 Å, but in this embodiment, the thickness is about 1,400 Å.

A silicon oxynitride layer 64 is provided over at least a portion of the tungsten silicide layer 62. The silicon oxynitride layer 64 is formed via suitable techniques including via physical vapor deposition (PVD) techniques. Methods of forming silicon oxynitride are known in the art. The silicon oxynitride layer 64 has a thickness from about 800 Å to about 1,200 Å, but in this embodiment, the thickness is about 1,000 Å.

Figure 12:
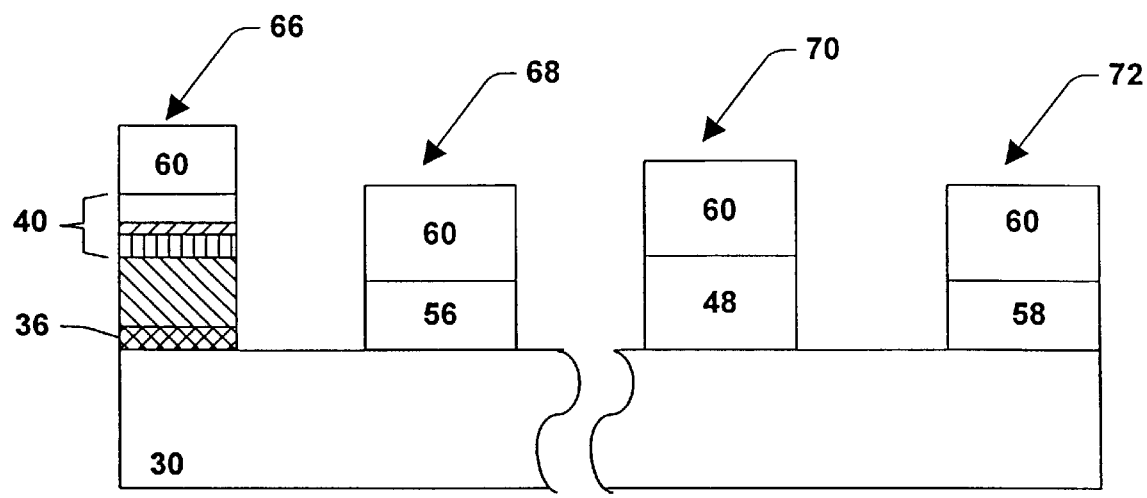
FIG. 12 is a cross sectional illustration of a NAND type flash memory device in accordance with the present invention.

Referring to FIG. 12, a series of masks and etch steps are employed to form various structures including a stacked flash memory cell 66, a select gate transistor 68, a high voltage gate transistor 70, and a low voltage gate transistor 72. Although not shown, various contacts and interconnects may be formed, as well as the deposition of an encapsulating oxide film, such as tetraethylorthosilicate (TEOS), borophosphotetraethylorthosilicate (BPTEOS), phosphosilicate glass (PSG), or borophosphosilicate glass (BPSG). The illustration of FIG. 12 is shown along a bit line.

Figure 13:
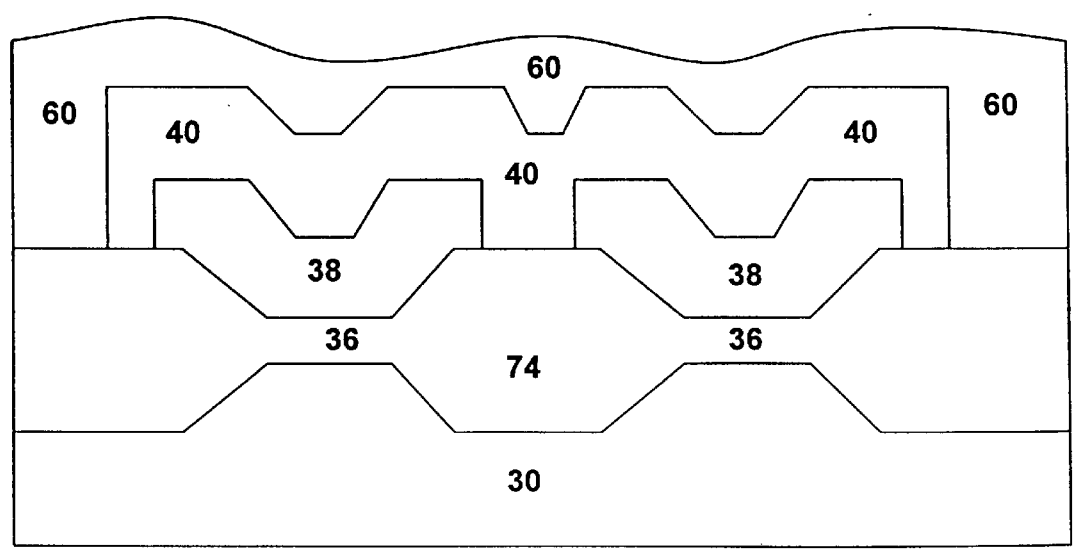
FIG. 13 is another cross sectional illustration of a NAND type flash memory device in accordance with the present invention.

Referring to FIG. 13, an illustration of a flash memory device made in accordance with the present invention is shown along a word line. On substrate 30, are field oxide regions 74 (not shown in FIG. 3–12), first gate oxide 36 (tunnel oxide), a first doped amorphous silicon layer 38 (Poly 1), dielectric layer 40 (such as an ONO multilayer dielectric), and a second doped amorphous silicon layer 60 (Poly 2).

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a NAND type flash memory device, comprising:

growing a first oxide layer over at least a portion of a substrate, the substrate including a core region and a periphery region, the core region including a flash memory cell area and a select gate area and the periphery region including a high voltage transistor area and low voltage transistor area;

depositing a first doped amorphous silicon layer over at least a portion of the first oxide layer;

depositing a dielectric layer over at least a portion of the first doped amorphous silicon layer;

removing portions of the first oxide layer, the first doped amorphous silicon layer, and the dielectric layer in the select gate area of the core region and the high voltage transistor area and the low voltage transistor area of the periphery region;

growing a second oxide layer over at least a portion of the substrate in the select gate area of the core region and the high voltage transistor area and the low voltage transistor area of the periphery region;

removing portions of the second oxide layer in the select gate area of the core region and the low voltage transistor area of the periphery region;

growing a third oxide layer over at least a portion of the substrate in the select gate area of the core region and the low voltage transistor area of the periphery region;

depositing a second doped amorphous silicon layer over at least a portion of the dielectric layer, the second oxide layer and the third oxide layer; and forming a flash memory cell in the flash memory cell area of the core region, a select gate transistor in the select gate area of the core region, a low voltage transistor in the low voltage transistor area of the periphery region, and a high voltage transistor in the high voltage transistor area of the periphery region.

2. The method of claim 1, wherein the first oxide layer has a thickness from about 80 Å to about 100 Å.

3. The method of claim 1, wherein the first doped amorphous silicon layer comprises a phosphorus in situ doped amorphous silicon layer.

4. The method of claim 1, wherein the first doped amorphous silicon layer has a thickness from about 700 Å to about 1,100 Å.

5. The method of claim 1, wherein the dielectric layer comprises a first oxide layer, a nitride layer over the first oxide layer, and a second oxide layer over the nitride layer.

6. The method of claim 1, wherein the second oxide layer has a thickness from about 270 Å to about 290 Å.

7. The method of claim 1, wherein the third oxide layer has a thickness from about 160 Å to about 180 Å.

8. The method of claim 1, wherein the second doped amorphous silicon layer comprises a phosphorus in situ doped amorphous silicon layer having a thickness from about 1,000 Å to about 1,400 Å.

9. The method of claim 1, wherein the flash memory cell comprises the first doped amorphous silicon layer over the first oxide layer, the dielectric layer over the first doped amorphous silicon layer, and the second doped amorphous silicon layer over the dielectric layer; the select gate transistor comprises the second doped amorphous silicon layer over the third oxide layer; the low voltage transistor comprises the second doped amorphous silicon layer over the third oxide layer; and the high voltage transistor comprises the second doped amorphous silicon layer over the second doped amorphous silicon layer over the second oxide layer.

10. A method of forming a flash memory cell and a select gate of a NAND type flash memory device, comprising:

growing a first oxide layer having a thickness from about 70 Å to about 110 Å over at least a portion of a substrate, the substrate including a core region, the core region including a flash memory cell area and a select gate area;

depositing a first doped amorphous silicon layer over at least a portion of the first oxide layer;

depositing a dielectric layer over at least a portion of the first doped amorphous silicon layer;

removing portions of the first oxide layer, the first doped amorphous silicon layer, and the dielectric layer in the select gate area of the core region;

growing a second oxide layer having a thickness from about 150 Å to about 190 Å over at least a portion of the substrate in the select gate area of the core region;

depositing a second doped amorphous silicon layer over at least a portion of the dielectric layer and the second oxide layer; and forming a flash memory cell in the flash memory cell area of the core region and a select gate transistor in the select gate area of the core region.

11. The method of claim 10, wherein the first oxide layer is a tunnel oxide layer in the flash memory cell.

12. The method of claim 10, wherein the second oxide layer is a gate oxide layer in the select gate transistor.

13. The method of claim 10, wherein the dielectric layer has a thickness from about 120 Å to about 140 Å and comprises a first oxide layer, a nitride layer over the first oxide layer, and a second oxide layer over the nitride layer.

14. The method of claim 10, wherein portions of the first oxide layer are removed using photolithographic techniques and wet etch techniques.

15. The method of claim 10, wherein steps associated with a tunnel oxide mask procedure are not performed.

16. A method of forming a NAND type flash memory device, comprising:

growing a first oxide layer having a thickness from about 70 Å to about 110 Å over at least a portion of a substrate, the substrate including a core region and a periphery region, the core region including a flash memory cell area and a select gate area and the periphery region including a high voltage transistor area and low voltage transistor area;

depositing a first phosphorus doped amorphous silicon layer over at least a portion of the first oxide layer;

depositing a multilayer dielectric over at least a portion of the first phosphorus doped amorphous silicon layer;

removing portions of the first oxide layer, the first phosphorus doped amorphous silicon layer, and the multilayer dielectric in the select gate area of the core region and the high voltage transistor area and the low voltage transistor area of the periphery region;

growing a second oxide layer having a thickness from about 260 Å to about 300 Å over at least a portion of the substrate in the select gate area of the core region and the high voltage transistor area and the low voltage transistor area of the periphery region;

removing portions of the second oxide layer in the select gate area of the core region and the low voltage transistor area of the periphery region;

growing a third oxide layer having a thickness from about 150 Å to about 190 Å over at least a portion of the substrate in the select gate area of the core region and the low voltage transistor area of the periphery region;

depositing a second phosphorus doped amorphous silicon layer over at least a portion of the multilayer dielectric, the second oxide layer and the third oxide layer;

depositing a tungsten silicide layer over the second phosphorus doped amorphous silicon layer; and forming a flash memory cell in the flash memory cell area of the core region, a select gate transistor in the select gate area of the core region, a low voltage transistor in the low voltage transistor area of the periphery region, and a high voltage transistor in the high voltage transistor area of the periphery region.

17. The method of claim 16, further comprising forming an interconnection with the select gate transistor via the second phosphorus doped amorphous silicon layer and the tungsten silicide layer.

18. The method of claim 16, further comprising depositing a silicon oxynitride layer over the tungsten silicide layer.

19. The method of claim 16, wherein the tungsten silicide layer is deposited using a mixture comprising $SiH_2Cl_2$ and $WF_6$.

20. The method of claim 16, wherein the tungsten silicide layer has a thickness from about 1,000 Å to about 1,800 Å.

* * * * *